(12) United States Patent  
Xu et al.

(10) Patent No.: US 7,356,317 B2
(45) Date of Patent: Apr. 8, 2008

(54) ADAPTIVE-BIASED MIXER (75) Inventors: Zhiwei Xu, Los Angeles, CA (US); Pei-Ming Daniel Chow, Los Angeles, CA (US); M. Frank Chang, Los Angeles, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 258 days.

(21) Appl. No.: 10/890,712

(22) Filed: Jul. 14, 2004

(65) Prior Publication Data

US 2006/0014509 A1    Jan. 19, 2006

(51) Int. Cl.
*H04B 1/10* (2006.01)
*H04B 1/26* (2006.01)

(52) U.S. Cl. .................. 455/130; 455/305; 455/326; 330/259

(58) Field of Classification Search ............... 455/63.1, 455/313–326, 333, 283, 284, 296, 305; 330/259, 330/261
See application file for complete search history.

(56) References Cited

U.S. PATENT DOCUMENTS

| | | | |
|---|---|---|---|
| 6,785,530 B2* | 8/2004 | Hatcher et al. | 455/326 |
| 2003/0001677 A1* | 1/2003 | Taniguchi et al. | 330/285 |
| 2004/0017862 A1* | 1/2004 | Redman-White | 375/319 |
| 2004/0106380 A1* | 6/2004 | Vassiliou et al. | 455/73 |
| 2004/0166824 A1* | 8/2004 | Franca-Neto | 455/296 |
| 2004/0189388 A1* | 9/2004 | Nguyen et al. | 330/254 |

* cited by examiner

*Primary Examiner*—Simon Nguyen
(74) *Attorney, Agent, or Firm*—DLA Piper US LLP (57) ABSTRACT A system or method for a circuit network that receives an RF signal, and where a plurality of switching transistors receive an RF signal output by the circuit network and perform mixing with a local oscillation (LO) signal received on a LO input. An active bias circuit performs active bias of the plurality of switching transistors in a feedback loop provided between the LO input and an output of the plurality of switching transistors.

27 Claims, 11 Drawing Sheets

ADAPTIVE-BIASED MIXER

BACKGROUND OF THE INVENTION

A. Field of the Invention

The present invention relates generally to the field of wireless communications. More particularly, the present invention relates to an adaptive-biased mixer for a wireless communication system.

B. Background

Recently, the demand for portable wireless communication systems has grown significantly, such as for wireless local area networks (LAN), home wireless control systems and wireless multimedia centers. With improved transistor scaling down technology and improved circuit techniques, more and more miniature chip systems, such as cellular phones, wireless network cards, personal radio messaging systems and control devices have emerged and been used by many people.

With many wireless devices working in the same frequency band, the interferences among these devices is becoming more and more severe. Current wireless systems require that the wireless devices be immune to off-channel interferences, whereby this requirement means that the wireless receiving devices need to become more linear. However, circuit linearity becomes worse as semiconductor technology scales down in size. This is primarily due to the fact that the supply voltage of a smaller feature size technology is generally smaller and the circuit voltage headroom becomes smaller as well, which hurts the circuit linearity. Although some technologies have the potential to support two different supply voltages, it is still hard to be used in a high frequency (e.g. radio frequency, or RF) application because high supply voltage devices are commonly used with lower speeds. Also, a double or triple supply voltage is not a viable option for wireless chip systems because of its complicated supply routing on a circuit board and the increased cost involved.

Thus, a high linear mixer that can work with a low supply voltage is a preferred choice to provide a highly linear wireless device. Since the noise figure of a down-conversion mixer affects the noise performance of the wireless receiver, low noise characteristics for the mixer are also preferred.

Another area that needs a highly linear mixer is a transmitter linearization loop. The portable characteristics of current wireless communication devices require power efficient receiving and transmitting. To meet this requirement, there has been performed research into the use of a low power transmitter, especially with respect to linearization techniques to enhance the linearity of power amplifiers and thereby avoid the in-band distortion and adjacent band interference. These linearization techniques are typically used in conjunction with the amplification of an amplitude-modulated signal, such as a QAM (Quadrature Amplitude Modulation) signal. This is because the power amplifier distorts the envelope of the fundamental frequency signal. With a linearization loop, the linear power amplifier can be achieved with a high power efficient non-linear power amplifier such as a class C or class E amplifier, which has much lower power consumption compared with the power hungry transmitter with a low efficiency linear power amplifier such as a class A amplifier. The additional power consumed by the linearization system needs to be considered in the calculation of the overall efficiency of the wireless communication system.

Several conventional linearization techniques are currently available. Table 1 characterizes these techniques by different properties. The first property distinguishes whether the technique is analog or digital. The second property distinguishes whether the technique is a compensation technique or a signal splitting technique.

TABLE 1

Linearization Techniques

| Linearization | Analog | Digital |
|---|---|---|
| Compensation Techniques | Cartesian Loop, Polar Loop, Envelope Feedback, Phase Correcting Feedback, Feed Forward | Mapping Techniques, Complex Gain Predistortion, Polar Predistortion |
| Signal Splitting Techniques | CALLUM, LINC, Envelope Elimination and Restoration | LINC |

Among these techniques, the Cartesian modulation feedback loop and Polar modulation feedback loop require a highly linear down-conversion mixer to boost the linearity of the transmitter. Since the Cartesian loop and the Polar loop are generally adopted in an integrated transmitter linearization implementation because of their simple architecture, and the transmitter linearity is determined by the linearity of the down-conversion mixer inside the loop, a highly linear mixer is desirable. For the same reasons as have been discussed in the receiver side, the mixer also needs to tolerate a low supply voltage.

A down-conversion mixer translates an incoming RF signal into a lower frequency by multiplying it with a local oscillation (LO) signal. With this frequency lowering technique, it becomes relatively easy to obtain the requisite gain in the receiver chain, accomplish the RF tuning by varying the local oscillator frequency, and distribute the gain over a number of different frequency bands to avoid the potential oscillation arising from parasitic feedback loops. Since the dynamic range requirements in modern high performance telecommunication systems are quite severe, approaching 100 dB in some instances, the higher onset of severe nonlinearities that accompany large input signals is better, which limits the ceiling of the system dynamic range. In a wireless receiver chain, the down-conversion mixer is an important component that restricts the increase of the dynamic range upper limit.

Figure 1:
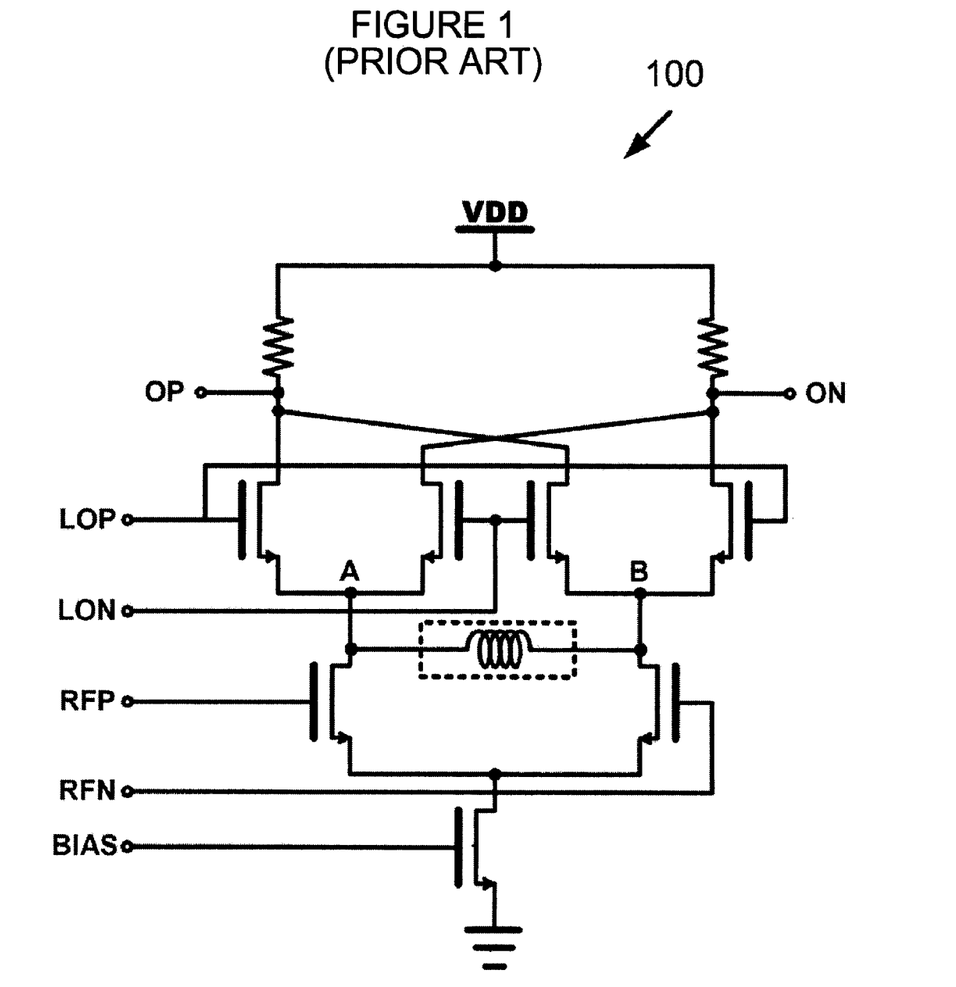
FIG. 1 shows a conventional direct conversion mixer.

Since the invention of Armstrong's frequency translation technique about 70 years ago, many types of mixers have been utilized for RF communications systems, whereby the basic concept is to do frequency conversion through switching. With a trend starting in the 1990s to implement an RF system into a single CMOS chip, these circuit architectures are also used in CMOS technology. FIG. 1 shows a mixer circuit 100 that is a popular choice for conventional wireless receivers, whereby this mixer circuit corresponds to a Gilbert Multiplier architecture and belongs to the 'active' category of mixers. The RF signals are fed into the mixer circuit 100 through a differential pair RFP, RFN, whereby the mixer amplifies the RF signals and isolates the signal mixing with a first stage low noise amplifier (LNA). Four switching transistors driven by the LO signal LOP, LON (differential pair) with large swing perform the double-balanced frequency translation. The even-order nonlinearity can be cancelled through this balanced implementation. The mixer circuit 100 is biased with a DC current source that is provided with a BIAS signal input.

Some current implementations use half of the circuit to serve as a mixer to the single RF input, which corresponds to a single balanced counterpart to the double balanced structure shown in FIG. 1. To decrease the noise contribution from point A and B in the LO frequency as shown in FIG. 1, there has been a proposal to use an inductor L to tune point A and B at the frequency of the LO, to lower the effect of noise mixing down.

Although the Gilbert-type double balanced mixer circuit 100 of FIG. 1 is simple and used a lot in bipolar technology, it has some disadvantages in deep sub-micron CMOS technology. First, the low supply voltage in deep sub-micron CMOS technology limits the linearity of the mixer. It is a three-layer device and each layer of the device eats into the voltage headroom. The voltage swing on the resistor load should be smaller than the supply voltage minus the voltage headroom of the three layer transistors, otherwise the output is distorted and linearity becomes worse. Second, the flicker noise hurts the mixer noise performance when NMOS transistors and direct conversion receiver architecture are exploited, which is the most popular and simple architecture for a wireless receiver and results in a smaller RF receiver chip. Although a full PMOS transistor implementation serves as another candidate, the low threshold frequency $f_T$ of the PMOS transistor resists this substitution because it doesn't work well when used as an RF input amplifier pair inside the mixer. Third, this type of mixer suffers from the mismatch problem because of its feature size amplifier transistors, which have poor matching characteristics over the larger devices, and whereby the quadrature current sources are mismatched as well.

The matching requirement of the LO switching transistors are relaxed compared with the others because the input LO signal has a large swing and saturates the switching device quickly. Because of the offset introduced by mismatches, the even order inter-modulation cannot be cancelled completely through a differential circuit and the even order linearity becomes worse than what is typically assumed. Furthermore, the bias voltage of the LO signals should be a little bit higher than what it is needed in the general case to accommodate the process variation, which also eats into the voltage headroom.

Figure 2:
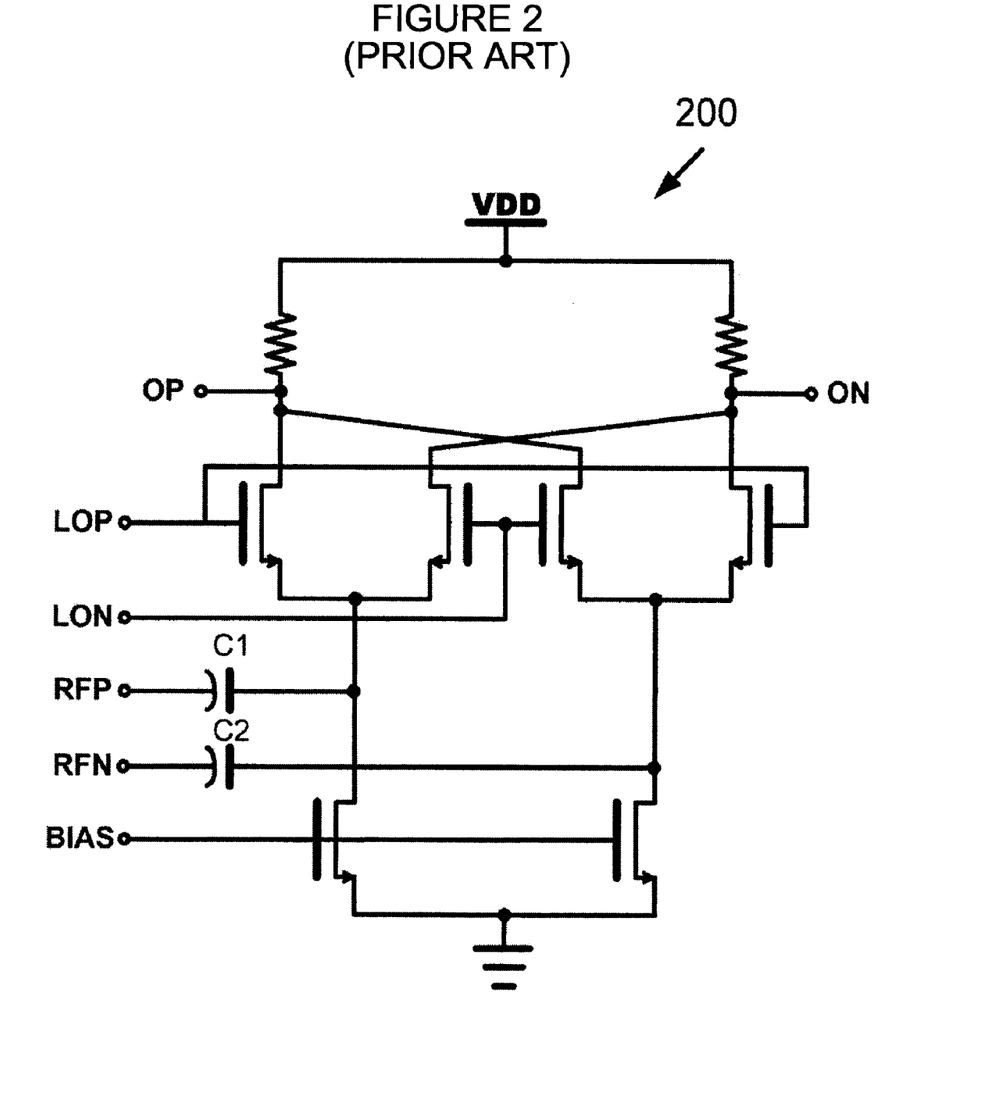
FIG. 2 shows another conventional direct conversion active mixer.

To increase the linearity performance of the mixer, several modifications have been done to the primitive Gilbert-type double balanced mixer circuit 100 of FIG. 1. FIG. 2 shows a first revised Gilbert double balanced mixer circuit 200 as is known in the art, whereby the RF differential signal pair RFP, RFN are injected into the circuit through coupling capacitors C1, C2 and current-voltage (I-V) conversion, which down converts to a low frequency directly by the use of switching transistors. The whole circuit is biased by two separate DC current sources that are provided with a BIAS signal.

The first revised Gilbert double balanced mixer circuit 200 of FIG. 2 provides for more voltage headroom to the mixer circuit and has better linearity performance, as compared to the mixer circuit 100 of FIG. 1. However, it still has the shortcoming of high flicker noise being converted in-band when NMOS transistors and a direct conversion architecture are used. Also, the even order signal distortion introduced by the mismatch of current source is not improved and still poses a problem with respect to linearity of the mixer.

Figure 3:
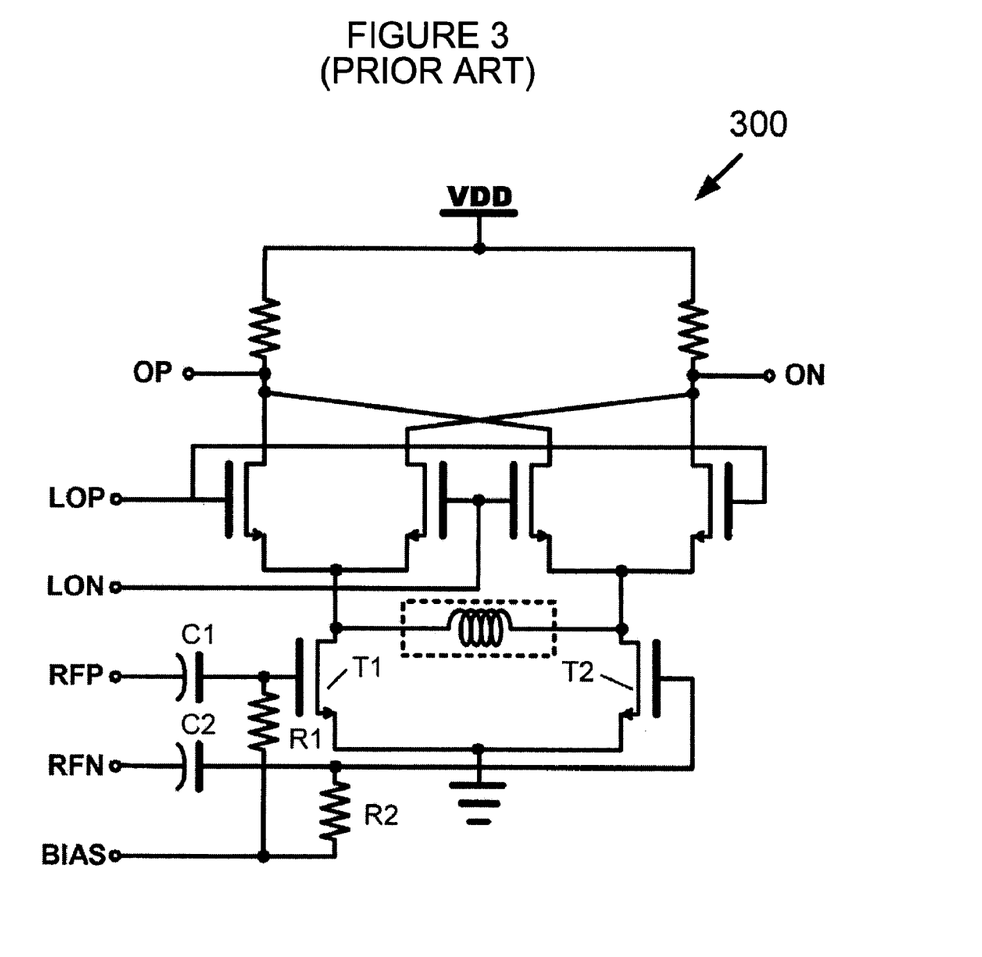
FIG. 3 shows yet conventional direct conversion active mixer.

FIG. 3 shows a second revised Gilbert type double balanced mixer circuit 300, which improves on the mixer circuit 200 of FIG. 2. The input RF amplifier transistors T1, T2 are biased by an external mirror circuit (see resistors R1, R2, capacitors C1, C2, and bias signal BIAS) and have a certain gain at RF frequency. Since the voltage overhead of the amplifier transistors T1, T2 is lower than that of the DC current source, the voltage headroom of the second revised mixer circuit 300 of FIG. 3 is larger than that of FIG. 2. However, the RF input transistor pair contributes to the distortion, so one can only compare the linearity performance of the mixer circuit 200 as shown in FIG. 2 and the mixer circuit 300 as shown in FIG. 3 on a case by case basis. Also, it still has the same problem of flicker noise and even order non-linearity as the mixer circuits 100, 200 of FIG. 1 and FIG. 2.

Figure 4:
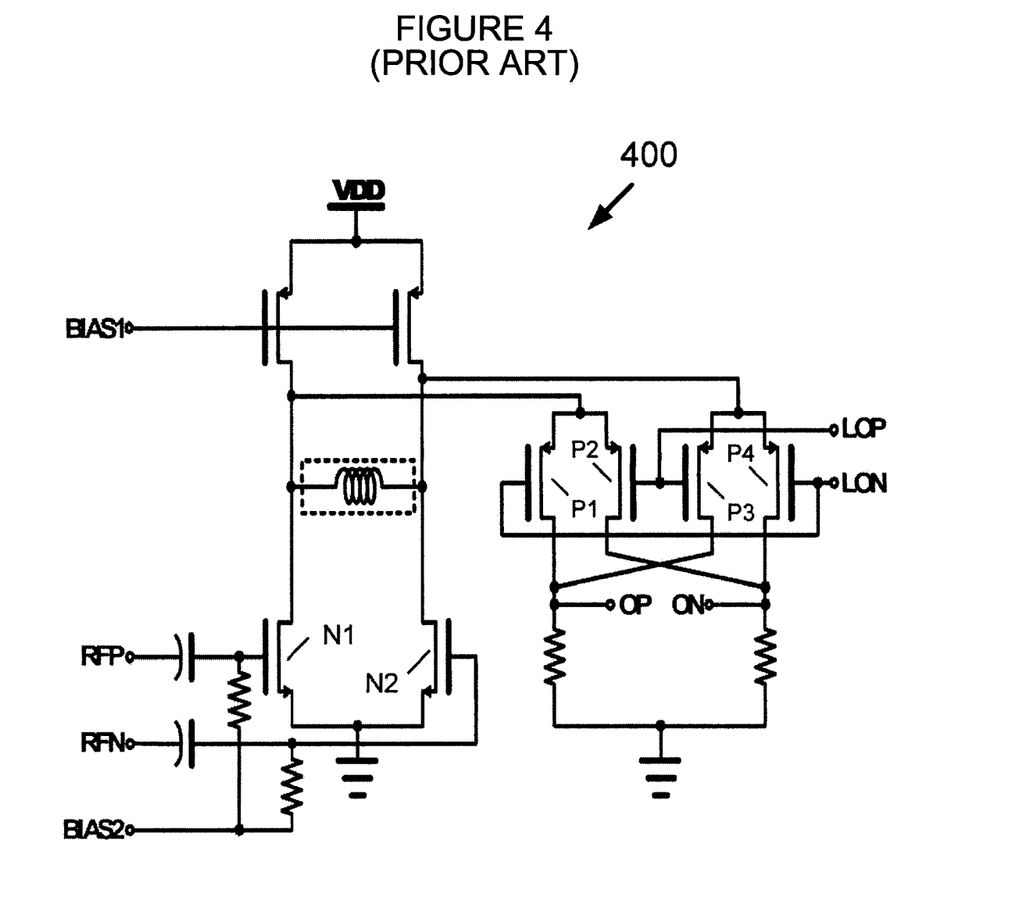
FIG. 4 shows still yet another conventional direct conversion active mixer.

To improve the noise performance of a down-conversion mixer in a direct conversion RF receiver, a folded PMOS double balanced mixer circuit 400 has been provided as shown in FIG. 4, whereby the mixer circuit 400 corresponds to an 'active' mixer. As shown in FIG. 4, PMOS transistors P1, P2, P3, P4 are used as the switching devices to perform the frequency conversion, and the RF input signal differential pair RFP, RFN are fed in through NMOS transistors N1, N2. In this way, the speed limit of the PMOS transistor in the RF range is avoided, whereby it is hard to get a reasonable gain because of low $f_T$. However, there is no such tight limitation in the switching transistors because it is driven by arbitrary large LO signals LOP, LON and works nonlinearly. Since the flicker noise of PMOS devices is much smaller than that of NMOS devices, the in-band noise performance of the PMOS mixer is better than the NMOS mixer. Also, because of the folding architecture, the mixer circuit 400 of FIG. 4 has more voltage headroom as compared with the NMOS Gilbert type double balanced mixer circuit 100 shown in FIG. 1, and the linearity performance is better. However, the even order non-linearity of the mixer circuit 400 of FIG. 4 introduced by mismatch is not improved and the LO biasing is sensitive to process variations.

The conventional mixer circuits described above belong to the active mixer classification, whereby these mixer circuits switch the current to a resistor load under the control of LO signals and which does the signal frequency translation. There is another type of mixer circuit which uses a voltage sample-and-hold circuit to do the down-conversion of the RF signals, in which no DC current flows through the switching transistors, whereby such a mixer circuit is categorized as a 'passive' mixer.

Figure 5:
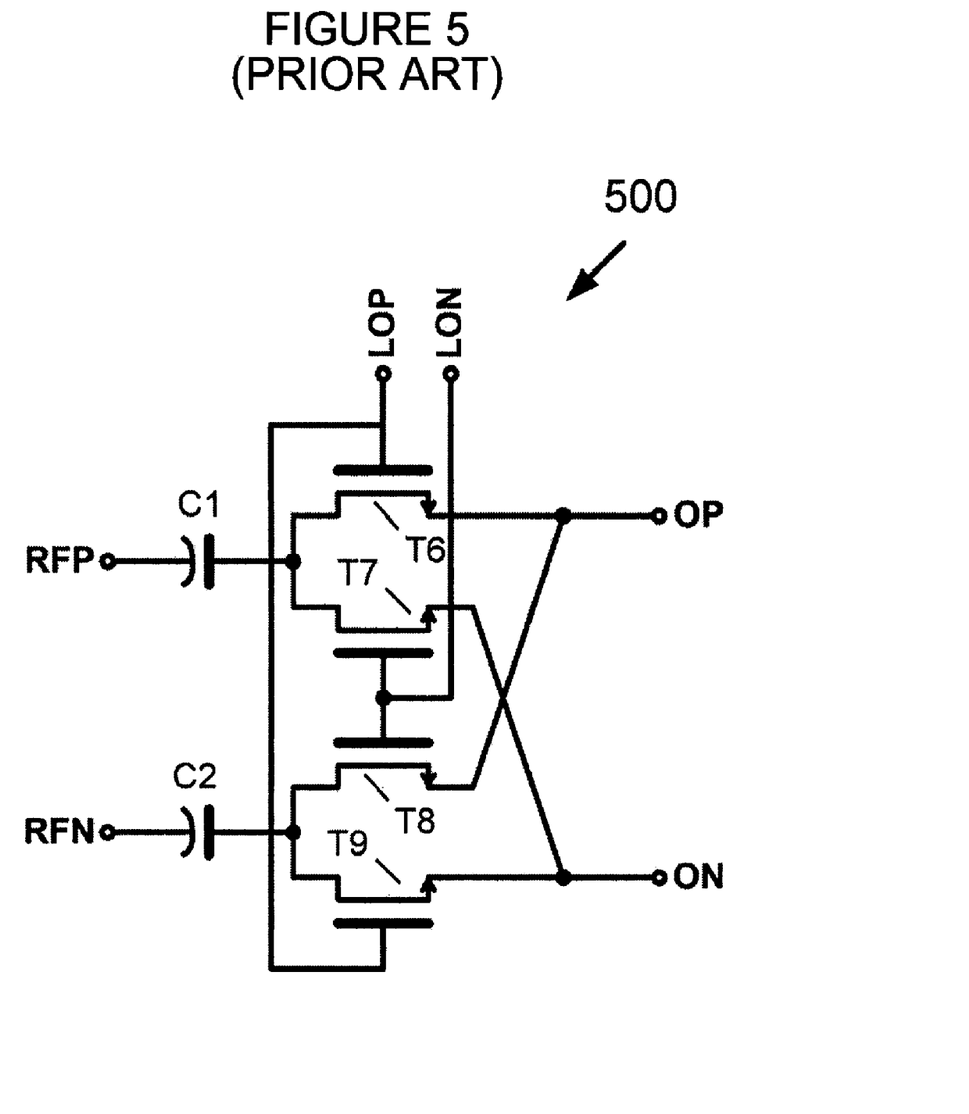
FIG. 5 shows a conventional passive mixer.

FIG. 5 shows a conventional NMOS double balanced passive mixer circuit 500. The RF input differential pair RFP, RFN are fed into the mixer circuit 500 through two coupling capacitors C1, C2, which also serve as a DC isolator between the mixer circuit 500 and a previous stage (not shown) of a wireless circuit. The output OP and ON are biased at the desired voltage. During operation of the mixer circuit 500, the switching transistors T6, T7, T8, T9 are controlled to be open or close by the LO signals LOP and LON. When the switch is closed, it tracks the input voltage; when the switch is open, the tracked voltage is held. The frequency translation is done through this track-and-hold of the switch.

Since there is no DC current in a passive mixer, it has the potential for extremely low-power operation considering that CMOS technology offers excellent switches. However, the passive mixer circuit 500 of FIG. 5 has the following drawbacks: 1) Although the single balanced passive mixer with even order linearity problem may have positive gain, the double balanced one is generally with loss, whose noise performance is not good; 2) The transistor switches slowly compared with the one that has DC bias current, which is regarded as a voltage controlled resistor and degrades the linearity; 3) Although there is no DC current in the NMOS transistor, the flicker noise cannot be removed because there is still instantaneous charging and discharging current that includes the channel flicker noise; and 4) Since the passive mixer uses voltage track-and-hold, it is sensitive to device mismatch. All of these drawbacks results in the decreased popularity of the passive mixer in an RF receiver design.

Figure 6:
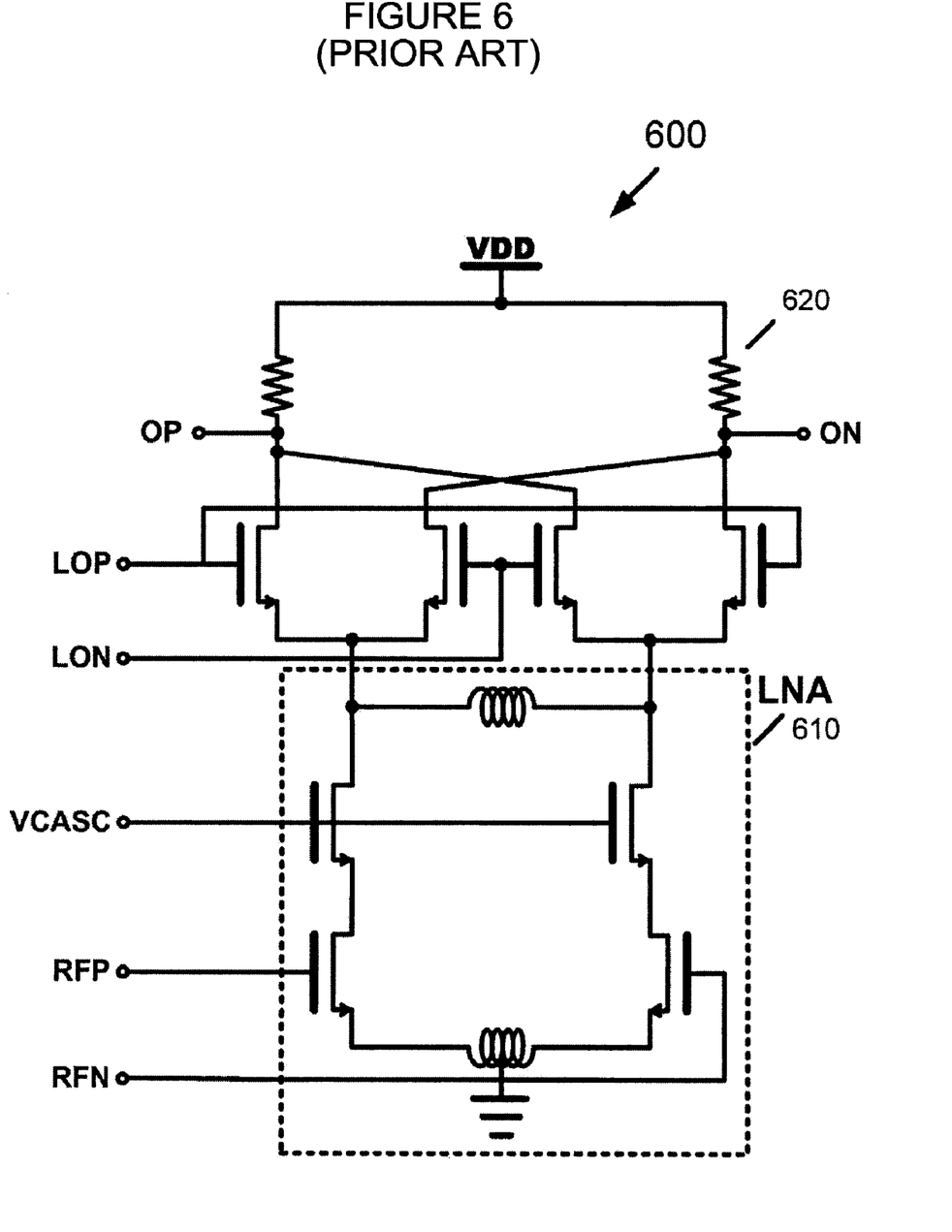
FIG. 6 shows a conventional RF front end with merged LNA and mixer.

An RF front-end with merged LNA and mixer has also been explored for use in an RF receiver design, as shown by the mixer/LNA circuit 600 in FIG. 6. The circuit 600 includes a differential LNA 610 and a double balanced mixer 620. The main purpose of this design is to reuse the DC current of the LNA and the mixer, which lowers the total power consumption of the RF front-end. Since it still uses a similar architecture as shown in FIGS. 1, 2 and 3, and the circuit voltage headroom is not increased, the performance is not improved very much if at all.

SUMMARY OF THE INVENTION

One aspect of the present invention provides for an adaptive biased mixer, which includes a circuit network that receives an RF differential signal pair and that output a differential signal pair. The mixer also includes a plurality of switching transistors that receive the differential signal pair output by the circuit network and that perform mixing with a differential local oscillation (LO) signal pair received on a LO input. The mixer further includes an active bias circuit that performs active bias of the plurality of switching transistors in a feedback loop provided between the LO input and a differential output of the plurality of switching transistors.

Another aspect of the present invention provides for a method of providing a highly-linear output for a mixer, which includes a step of receiving an RF differential signal pair output by a low noise amplifier. The method also includes a step of switching the RF differential signal pair with a differential local oscillation (LO) signal pair received on a LO differential input, to perform a mixing of the RF differential signal pair with the LO signal pair to provide a differential mixed signal pair, the switching being perform by using a plurality of switching transistors. The method further includes a step of performing active bias of the plurality of switching transistors in a feedback loop provided between the LO differential input and a differential output of the mixer.

Other features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The foregoing advantages and features of the invention will become apparent upon reference to the following detailed description and the accompanying drawings, of which.

DETAILED DESCRIPTION OF THE INVENTION

The present invention according to at least one embodiment is directed to a highly linear mixer for use in an RF receiver, such as for use in a wireless RF receiver system.

Figure 7:
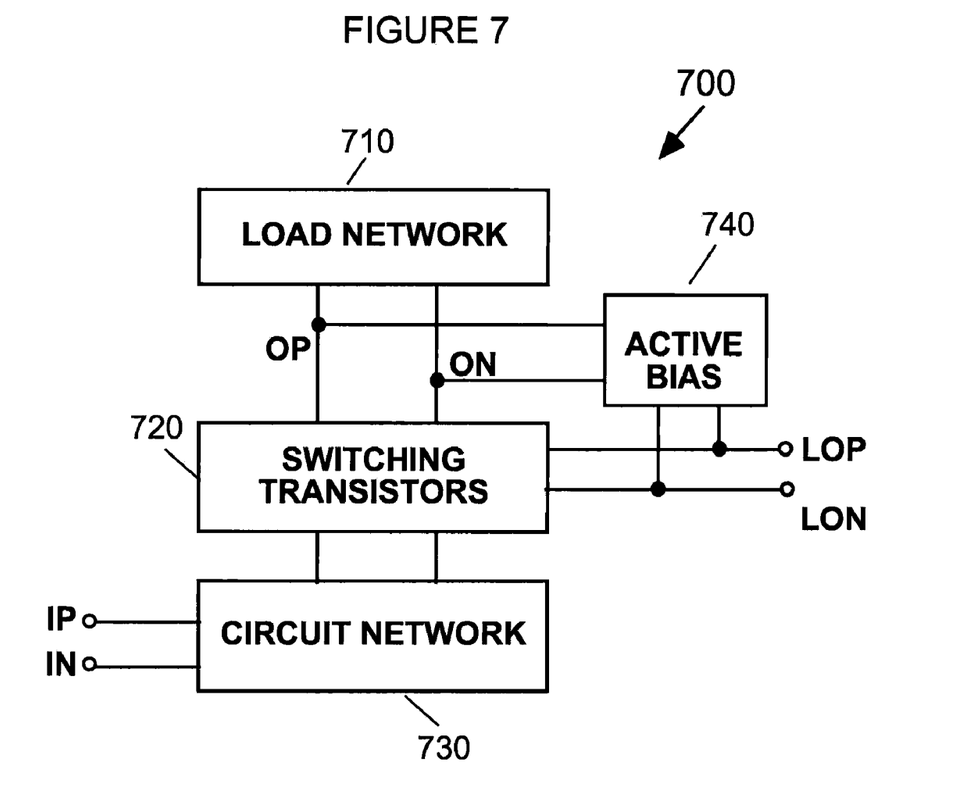
FIG. 7 shows an adaptive biased mixer in block diagram form according to a first embodiment of the invention.

FIG. 7 shows a block diagram of a mixer with an adaptive bias circuit according to a first embodiment of the invention. The mixer has improved receiver noise, linearity performance and can use a single low supply voltage in a direct conversion architecture, which are all beneficial features. The bias voltages of the switching transistors are defined by a feedback loop which adaptively controls the LO bias voltage according to an output common mode voltage. Since the feedback circuit preferably has a large close loop gain, the output common mode voltage can be controlled accurately and the mismatches introduced by the switching devices are also cancelled by the adaptive bias circuitry if separate bias loops are adopted in an alternative implementation.

The first embodiment utilizes an active feedback bias circuit to bias the LO signal DC voltage of the nonlinear switching transistors used in the mixer. In more detail, a mixer 700 according to the first embodiment includes a load network 710 (which receives the output mixed signal pair OP, ON), switching transistors 720 (which receive the LO differential pair LOP, LON), a circuit network 730 (which receives the input differential pair IP, IN), and an active bias circuit 740. The active bias circuit 740 is provided in a feedback loop with respect to the switching transistors 720.

Figure 8:
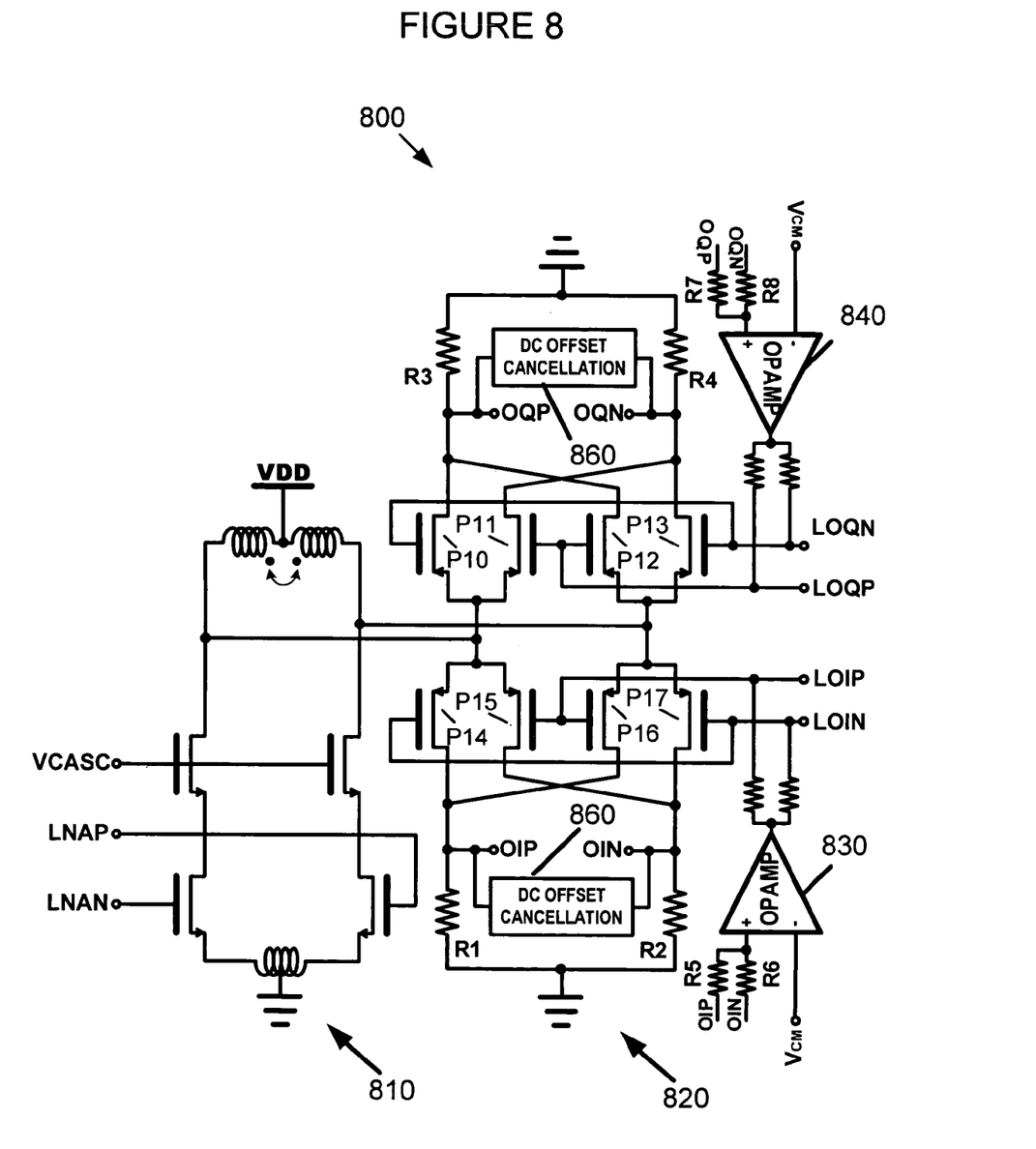
FIG. 8 shows an adaptive biased mixer in circuit form according to the first embodiment of the invention.

FIG. 8 shows a PMOS implementation of a mixer/LNA circuit 800 according to the first embodiment. A mixer 820 uses low flicker noise PMOS transistors P10, P11, P12, P13, P14, P15, P16, P17 as switches and is adaptive biased by a feedback loop to support the desired common voltage in the output. The RF signal is fed into the mixer 820 directly from an LNA 810 (LNAP, LNAN are the RF signal differential pair input to the LNA 810), and is converted into a baseband signal in both current mode and voltage mode. Since the bias current of the mixer/LNA circuit 800 is quite small and the extra current consumed by the feedback loop is also negligible compared with the current consumption of LNA, this folded merged RF front-end has a low power consumption.

In the circuit structure of FIG. 8, the OpAmps 830, 840 correspond to a portion of the Active Bias circuit 740 of FIG. 7, whereby the resistors R5, R6, R7, R8 correspond to a remaining portion of the Active Bias circuit 740. Note that the signals OIP, OIN, OQP, OQN of the mixer portion 800 are input to the OpAmps 830, 840, whereby line connections between these elements is not shown in FIG. 8 so as make that figure easier to view.

In an RF receiver, high linearity is desired to allow the RF receiver to work well even when there is strong adjacent channel interferences. The linearity-limiting factor in a well-designed receiver chain is generally the down-conversion mixer, especially for a direct conversion architecture. The first embodiment of the invention provides for an adaptive biased mixer circuit with high linearity and low noise performance, which can work at a low supply voltage and whose output DC voltage is well-controlled and immune to process variation.

An offset cancellation unit 860 is also included in the circuit of FIG. 8 so as to improve the even order distortion characteristics of the mixer, whereby the offset cancellation unit 860 is not sensitive to the intrinsic mismatch and DC offset voltage generated in a direct conversion receiver. One possible circuit implementation of the offset cancellation unit 860 is shown by way of an offset cancellation circuit 1000 in FIG. 10.

As shown in FIG. 8, the left block in that figure is a differential input LNA 810. The output of the LNA 810 is directly sent to the input of quadrature switching transistors, whereby the mixer 820 shown in FIG. 8 utilizes PMOS transistors. The LO signal bias circuit is an important feature of the mixer according to the first embodiment that does not use a DC bias current. In the first embodiment, a feedback circuit is utilized to bias the LO signals, whereby the feedback circuit compares the common voltage of the I branch differential output OIP and OIN with a pre-defined baseband common voltage with an opamp OPAMP, and adjusts the DC bias voltage of the LO signals accordingly. Thus, the pre-defined baseband common voltage and the mixer load resistor determine the bias current in a mixer controlled by a feedback loop according to the first embodiment.

Figure 9:
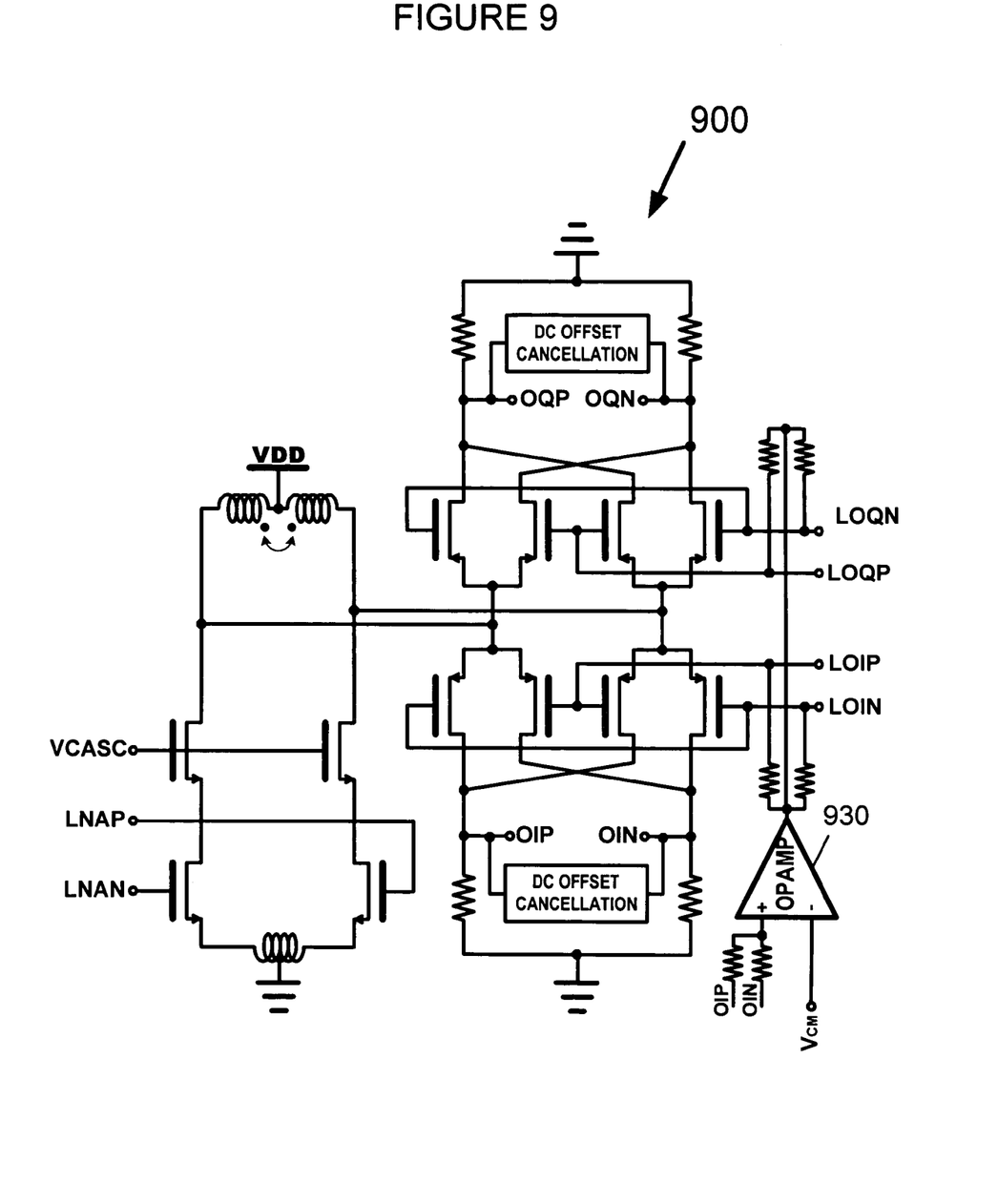
FIG. 9 shows an adaptive biased mixer in circuit form according to a second embodiment of the invention.

By using an adaptive biased mixer technique, the output voltage headroom is equal to the supply voltage minus the overhead voltage of the switching transistors, which is larger than that of a conventional active mixer and so has better linearity. Also, because it exploits fewer transistors in the signal path and supports the same level of gain, the noise performance is also improved. Compared with a passive mixer, the switching transistor is with DC bias current and can work faster than the switching transistors in a passive mixer. Thus, the non-linearity contributed from the slow switching of the passive mixer is less severe and a much better linearity performance over the passive mixer can be achieved. With positive gain, the adaptive biased mixer according to the first embodiment also has better noise performance over a passive mixer. Furthermore, the mismatch inside the adaptive biased mixer becomes less severe because the feedback loop attenuates the effect of circuit mismatch with a high loop gain. If the circuit mismatch requirement is not very tight, a more compact mixer circuit with a shared bias circuit 900 can be used, as shown in FIG. 9, which corresponds to a second embodiment of the invention. In FIG. 9, only one OpAmp 930 is utilized in the feedback path, as compared to the use of two separate OpAmps 830, 840 in FIG. 8.

Although the effect of circuit mismatch is improved by having the feedback loop, the mismatch introduced by the offset DC voltage resulting from LO signal and RF signal self-mixing still exists, which becomes more serious when a direct conversion architecture is adopted. This is because part of the LO signals are coupled to the mixer input or LNA input, which is resent to the mixer again with desired signals and multiplied with LO signals into DC voltage. In a direct conversion receiver, the generated DC voltage by the self mixing falls in-band and degrades the receiving signal quality, and it also causes an offset voltage in the mixer and in a following circuit in the RF receiver chain if not cancelled, which induces an even order nonlinearity. In a heterodyne receiver or a high IF receiver, the generated DC voltage by the LO self-mixing makes the circuit imbalanced and introduces an even order nonlinearity as well.

Figure 10:
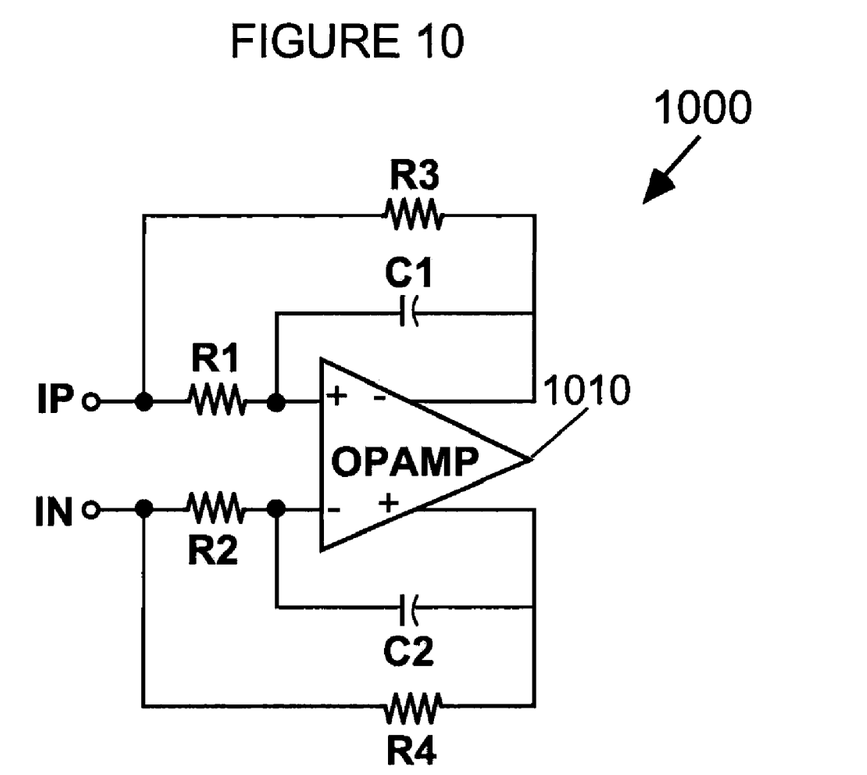
FIG. 10 shows a DC cancellation circuit that can be utilized in an adaptive biased mixer according to any of the embodiments of the invention.

Accordingly, a DC offset voltage cancellation circuit inside the mixer can be used to remove the generated DC offset voltage by self-mixing, and to thereby improve the even order linearity performance. FIG. 10 shows a DC offset cancellation circuit 1000 that can be utilized with a mixer according to either the first or second embodiments. The output voltage across the I-channel differential pair OIP, OIN and the Q-channel differential pair OQP, OQN of the mixer is sent to the DC offset cancellation circuit 1000, which is filtered with a first order active filter composed of an opamp OPAMP, resistors R1, R2, and capacitors C1 and C2.

The filter corner controlled by resistor/capacitor pair R1 and C1 and by the resistor/capacitor pair R2 and C2 can be as low as several thousand Hertz. Therefore, the generated DC offset voltage is amplified by the gain of opamp while the low pass filter attenuates the desired signal in the high frequency. Then, referring to FIG. 8, the filtered DC voltage from the opamp 1010 is subtracted from the signal on the mixer output OIP, OIN and OQP, OQN by a designed ratio, which is determined by the down-conversion mixer load resistors R1, R2, R3, R4 as shown in FIG. 8, and the resistors R3, R4 in the DC offset cancellation circuit 1000 as shown in FIG. 10.

Figure 11:
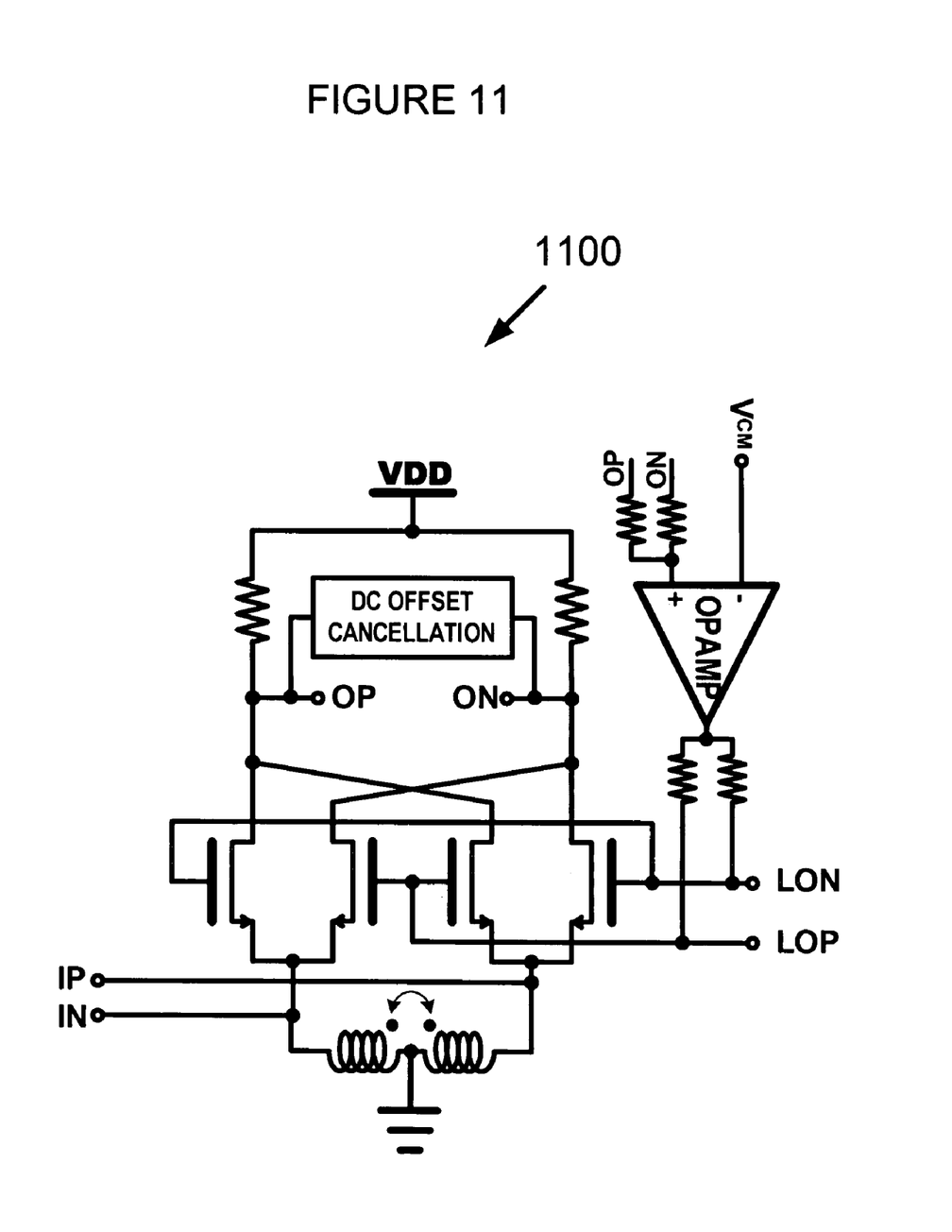
FIG. 11 shows an adaptive biased mixer in circuit form in circuit form according to a third embodiment of the invention.

An adaptive biased down-conversion mixer according to at least one embodiment of the invention can utilize NMOS for its switching transistors if flicker noise is not a major concern, and the architecture can be used in bipolar or BiCMOS technology as well. FIG. 11 shows an example of an NMOS implementation of an adaptive biased mixer 1100 according to a third embodiment of the invention.

Therefore, a highly linear, low noise mixer has been described that has at least one of the following properties: a) Adaptive bias loop by using active feedback to support the DC bias voltage of the LO signals in mixer, which increase the voltage headroom inside the circuit and maximizes the voltage dynamic range, which contributes to the linearity improvement. This can be used in various different types of technologies. b) Folded mixer architecture merged with LNA, which increases the voltage headroom of the mixer circuit and improves the linearity performance. This can be used in other types of technologies such as CMOS, Bipolar, and BiCMOS. c) Separate adaptive bias loop circuits that cancel the circuit quadrature mismatch by the high close-loop gain. This attenuates the even order distortion caused by the circuit mismatch. d) Local DC offset cancellation circuit to remove the generated DC offset voltage by the LO self-mixing or RF signal self-mixing. The mixer even order linearity is improved more than 20 dB when there is strong LO leakage in the receiver side or transmitter side.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the invention and its practical application to enable one skilled in the art to utilize the invention in various embodiments and with various modifications as are suited to the particular use contemplated. For example, while the switching transistors have been shown in the embodiments as being metal oxide semiconductor (MOS) transistors, other types of switching transistors, such as bipolar junction transistors (BJTs) and/or field effect transistors (FETs) may be utilized in alternative implementations.

What is claimed is:

1. An adaptive biased mixer, comprising:
a circuit network that receives an RF differential signal pair and that outputs a differential signal pair;
a plurality of switching transistors that receive the differential signal pair output by the circuit network and that perform mixing with a differential local oscillation (LO) signal pair received on a LO input; and
an active bias circuit that performs active bias of the plurality of switching transistors in a feedback loop provided between the LO input and a differential output of the plurality of switching transistors;
wherein the plurality of switching transistors are biased, without supply of bias from a DC bias current source, to a same voltage via the active bias circuit; and
wherein the active bias circuit defines bias signals of the plurality of switching transistors via the feedback loop, which adaptively controls a LO bias voltage of each switching transistor.

2. The adaptive biased mixer according to claim 1, further comprising:
a load network that is coupled to the differential output of the plurality of switching transistors, and that provides a load for the differential output of the plurality of switching transistors.

3. The adaptive biased mixer according to claim 2, further comprising:
a DC offset cancellation circuit provided between the plurality of switching transistors and the active bias circuit.

4. The adaptive biased mixer according to claim 1, further comprising:
a DC offset cancellation circuit provided between the plurality of switching transistors and the active bias circuit.

5. The adaptive biased mixer according to claim 1, wherein at least one of the plurality of switching transistors is an N-type metal oxide semiconductor (NMOS) transistor.

6. The adaptive biased mixer according to claim 1, wherein at least one of the plurality of switching transistors is a P-type metal oxide semiconductor (PMOS) transistor.

7. The adaptive biased mixer according to claim 1 wherein at least one of the plurality of switching transistors is a bipolar junction transistor (BJT).

8. The adaptive biased mixer according to claim 1, wherein at least one of the plurality of switching transistors is a field effect transistor (FET).

9. adaptive biased mixer according to claim 1, wherein the active bias circuit comprises an operational amplifier.

10. The adaptive biased mixer according to claim 1, further comprising:
a low noise amplifier (LNA) that is folded with the mixer.

11. An adaptive biased mixer, comprising:
an input circuit that receives an RF signal;
switching circuitry that switches the RF signal with a local oscillation (LO) signal received on an LO input, to perform a mixing of the RF signal with the LO signal to provide a mixed signal; and
active bias circuitry that performs active biasing of the switching circuitry in a feedback loop provided between the LO input and an output of the switching circuitry;
wherein transistors in the switching circuitry are biased, without supply of bias from a DC bias current source, to a same voltage via the active bias circuit; and
wherein the active bias circuitry defines bias signals of the transistors via the feedback loop, which adaptively controls a LO bias voltage of each switching transistor.

12. The adaptive biased mixer according to claim 11, wherein the received RF signal is a differential RF signal pair, and wherein the switching circuitry performs mixing with a differential local oscillation signal pair received on the LO input.

13. The adaptive biased mixer according to claim 12, further comprising:
load circuitry that provides a load for the differential output of the switching means.

14. The adaptive biased mixer according to claim 11, further comprising:
a DC offset cancellation that cancels a DC offset in signals output by the adaptive biased mixer.

15. The adaptive biased-mixer according to claim 11, wherein the switching circuitry includes at least one metal oxide semiconductor (MOS) switching transistor.

16. The adaptive biased-mixer according to claim 11, wherein the switching circuitry includes at least one bipolar junction (BJT) switching transistor.

17. The adaptive biased-mixer according to claim 11, wherein the switching circuitry includes at least one field effect (FET) switching transistor.

18. The adaptive biased-mixer according to claim 11, wherein the active bias circuitry includes an operational amplifier.

19. A method of providing a highly-linear output for a mixer, comprising:
receiving an RF signal output by a low noise amplifier;
switching the RF signal with a local oscillation (LO) signal received on an LO input, to perform a mixing of the RF signal with the LO signal to provide a mixed signal, the switching being perform by using a plurality of switching transistors;
performing active bias of the plurality of switching transistors in a feedback loop provided between the LO input and an output of the mixer, wherein the plurality of switching transistors are biased, without supply of bias from a DC bias current source, to a same voltage via the active bias circuit; and
defining bias signals of the plurality of switching transistors via the feedback loop, which adaptively controls a LO bias voltage of each switching transistor.

20. The method according to claim 19, wherein the received RF signal is a differential RF signal pair, and wherein the switching step performs mixing with a differential local oscillation signal pair received on the LO input.

21. The method according to claim 19, wherein at least one of the plurality of switching transistors is a metal oxide semiconductor (MOS) transistor.

22. The method according to claim 19, wherein at least one of the plurality of switching transistors is a bipolar junction transistor (BJT).

23. The method according to claim 19, wherein at least one of the plurality of switching transistors is a field effect transistor (FET).

24. The method according to claim 19, wherein the active bias step includes feeding back a signal through an operational amplifier.

25. The method according to claim 19, further comprising: canceling a DC offset in signals output by the mixer.

26. method according to claim 19, further comprising: providing the mixed signal to a load network.

27. The method according to claim 19, further comprising:
   merging a low noise amplifier with the mixer, to provide a folder construction.

* * * * *